US012740240B2

(12) United States Patent
Lu

(10) Patent No.: US 12,740,240 B2
(45) Date of Patent: Sep. 15, 2026

(54) DISPLAY PANEL AND MANUFACTURING METHOD THEREOF

(71) Applicant: TCL China Star Optoelectronics Technology Co., Ltd., Shenzhen (CN)

(72) Inventor: Macai Lu, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 790 days.

(21) Appl. No.: 17/994,044

(22) Filed: Nov. 25, 2022

(65) Prior Publication Data

US 2024/0138185 A1 Apr. 25, 2024
US 2024/0237400 A9 Jul. 11, 2024

(30) Foreign Application Priority Data

Oct. 25, 2022 (CN) ........................ 202211310356.6

(51) Int. Cl.
*H10K 59/121* (2023.01)
*H10D 30/67* (2025.01)
(Continued)

(52) U.S. Cl.
CPC ..... *H10K 59/1213* (2023.02); *H10D 30/6757* (2025.01); *H10D 86/421* (2025.01);
(Continued)

(58) Field of Classification Search
CPC ............ H10D 39/6757; H10D 86/421; H10D 86/441; H10D 86/60; H10D 86/411;
(Continued)

(56) References Cited

U.S. PATENT DOCUMENTS 5,563,432 A * 10/1996 Miura .................. G02F 1/1368 257/659
2006/0061701 A1* 3/2006 Chang .............. G02F 1/136213 349/43

(Continued)

FOREIGN PATENT DOCUMENTS

CN 103403850 11/2013
CN 103531591 1/2014

(Continued)

OTHER PUBLICATIONS

Notification of Office Action and Search Report Dated Dec. 1, 2022 From the State Intellectual Property Office of the People's Republic of China Re. Application No. 202211310356.6 and Its Translation Into English. (29 Pages).

*Primary Examiner* — Galina G Yushina

(57) ABSTRACT

A display panel and a manufacturing method thereof are disclosed. The display panel includes a substrate, an active layer, and a first metal layer. The active layer is disposed on one side of the substrate and includes a plurality of driving active parts, and each driving active part includes a first conductive subsection and a second conductive subsection spaced apart from each other, and a channel subsection connected between the first conductive subsection and the second conductive subsection. The first metal layer is disposed on one side of the active layer away from the substrate and includes a plurality of driving gates. A size of the channel subsection in a first direction is less than a size of the driving gates in the first direction, and the first direction is a direction in which the first conductive subsection points to the second conductive subsection.

11 Claims, 9 Drawing Sheets

(51) Int. Cl.

| | |
|---|---|
| ***H10D 86/40*** | (2025.01) |
| ***H10D 86/60*** | (2025.01) |
| ***H10K 59/12*** | (2023.01) |
| ***H10K 59/131*** | (2023.01) |

(52) U.S. Cl.
CPC ........... *H10D 86/441* (2025.01); *H10D 86/60* (2025.01); *H10K 59/131* (2023.02); *H10K 59/1201* (2023.02)

(58) Field of Classification Search
CPC .... H10D 86/481; H10D 62/235; H10D 64/01; H10D 64/512; H10D 86/0221; H10H 29/142; H10K 59/1213; H10K 59/12; H10K 59/131; H10K 59/10; H10K 59/1201; H10K 29/127; H10B 45/60
See application file for complete search history.

(56) References Cited

U.S. PATENT DOCUMENTS

| | | | | |
|---|---|---|---|---|
| 2018/0151606 | A1 | 5/2018 | Park | |
| 2020/0144304 | A1* | 5/2020 | Ji | H10D 86/60 |
| 2024/0046861 | A1* | 2/2024 | Wang | H10K 59/126 |

FOREIGN PATENT DOCUMENTS

| | | | | |
|---|---|---|---|---|
| CN | 107464820 | | 12/2017 | |
| CN | 108206010 | | 6/2018 | |
| CN | 108281430 | | 7/2018 | |
| CN | 109713043 | | 5/2019 | |
| CN | 113053914 | | 6/2021 | |
| CN | 113506831 | * | 10/2021 | H10D 30/6757 |
| CN | 113871400 | * | 12/2021 | H10D 86/44 |
| CN | 114823736 | | 7/2022 | |
| DE | 102018112532 | * | 12/2018 | G09G 3/3266 |

* cited by examiner

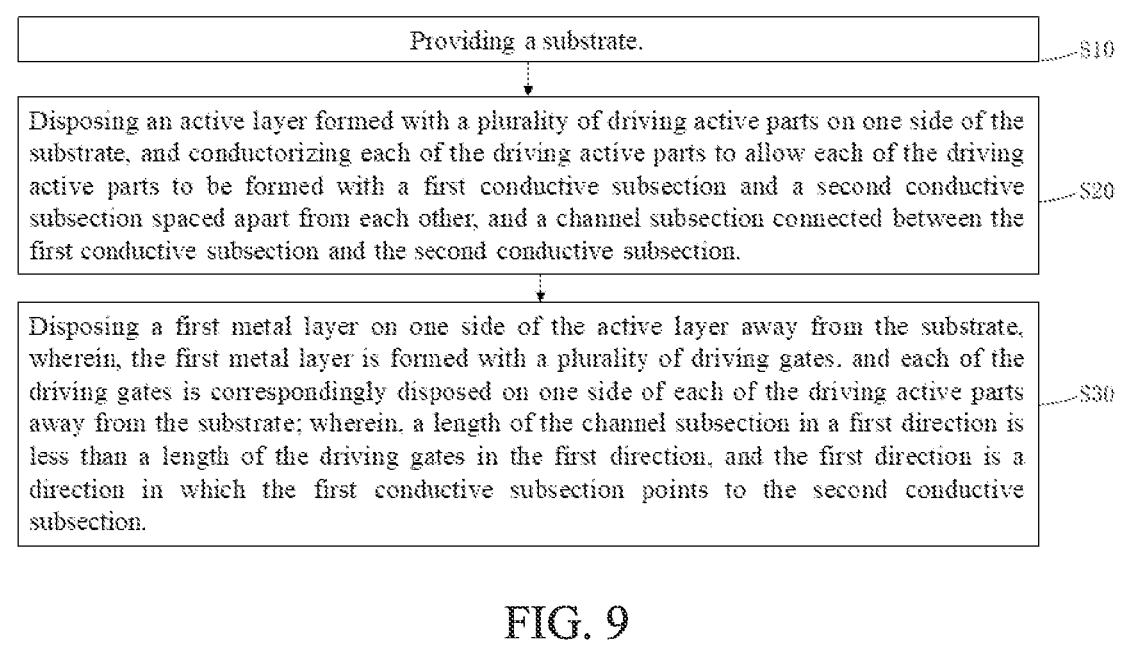

Providing a substrate. S10

Disposing an active layer formed with a plurality of driving active parts on one side of the substrate, and conductorizing each of the driving active parts to allow each of the driving active parts to be formed with a first conductive subsection and a second conductive subsection spaced apart from each other, and a channel subsection connected between the first conductive subsection and the second conductive subsection. S20

Disposing a first metal layer on one side of the active layer away from the substrate, wherein, the first metal layer is formed with a plurality of driving gates, and each of the driving gates is correspondingly disposed on one side of each of the driving active parts away from the substrate; wherein, a length of the channel subsection in a first direction is less than a length of the driving gates in the first direction, and the first direction is a direction in which the first conductive subsection points to the second conductive subsection. S30

FIG. 9

DISPLAY PANEL AND MANUFACTURING METHOD THEREOF

RELATED APPLICATION

This application claims the benefit of priority of Chinese Patent Application No. 202211310356.6 filed on Oct. 25, 2022, the contents of which are incorporated by reference as if fully set forth herein in their entirety.

FIELD OF INVENTION

The present disclosure relates to the field of display technologies, and more particularly, to a display panel and a manufacturing method thereof.

BACKGROUND OF INVENTION

Organic light-emitting diode (OLED) display devices, micro-light-emitting diode (micro-LED) display devices, and mini-light-emitting diode (mini-LED) display devices are all emerging display technologies that use current-driven displays.

In the OLED, micro-LED, and mini-LED display devices, luminescence of display devices is realized by transmitting electric signals to organic light-emitting layers or LED chips from driving transistors. Therefore, the driving transistors require a larger current-passing capacity. However, current driving transistors usually use oxide semiconductor materials as active layers, and if the current-passing capacity of the driving transistors needs to be improved, a mobility of the oxide semiconductor materials needs to be improved. However, when the mobility of the oxide semiconductor materials is improved, stability thereof will be reduced, causing the stability and the mobility of the driving transistors cannot be balanced, thereby being unable to effectively improve the current-passing capacity of the driving transistors.

SUMMARY OF INVENTION

The embodiments of the present disclosure provide a display panel and a manufacturing method thereof, which can realize driving transistors having a short channel, thereby improving a current-passing capacity of the driving transistors.

An embodiment of the present disclosure provides a display panel, which includes a plurality of driving transistors, wherein, each of the driving transistors includes a driving active part, a driving gate, and a driving source and a driving drain connected to the driving active part.

The display panel further includes:

a substrate;

an active layer disposed on one side of the substrate and including a plurality of driving active parts; and a first metal layer disposed on one side of the active layer away from the substrate and including a plurality of driving gates, wherein, each driving gate is correspondingly disposed on one side of each driving active part away from the substrate;

wherein, each driving active part includes a first conductive subsection and a second conductive subsection spaced apart from each other, and a channel subsection connected between the first conductive subsection and the second conductive subsection; and a size of the channel subsection in a first direction is less than a size of the driving gate in the first direction, and the first direction is a direction in which the first conductive subsection points to the second conductive subsection.

In an embodiment of the present disclosure, in each of the driving transistors, an orthographic projection of the channel subsection on the substrate is within a coverage range of an orthographic projection of the driving gate on the substrate, and an orthographic projection of the first conductive subsection on the substrate and an orthographic projection of the second conductive subsection on the substrate all partially overlap with the orthographic projection of the driving gate on the substrate.

In an embodiment of the present disclosure, in the first direction, a length of an overlapping portion between the orthographic projection of the first conductive subsection on the substrate and the orthographic projection of the driving gate on the substrate, and a length of an overlapping portion between the orthographic projection of the second conductive subsection on the substrate and the orthographic projection of the driving gate on the substrate are all greater than or equal to 0.25 μm.

In an embodiment of the present disclosure, a distance from a boundary of the orthographic projection of the channel subsection on the substrate to a boundary of the orthographic projection of the driving gate on the substrate is greater than or equal to 2.5 μm, and a length of the channel subsection in the first direction is less than or equal to 2.5 μm.

In an embodiment of the present disclosure, the first metal layer further includes a plurality of storage electrode elements spaced apart from the driving gates, and each of the storage electrode elements is correspondingly disposed on one side of each of the driving active parts away from the substrate and is disposed opposite to the first conductive subsection or the second conductive subsection of each of the driving active parts.

In an embodiment of the present disclosure, the display panel further includes a second metal layer disposed on one side of the first metal layer away from the active layer, wherein, the second metal layer includes a plurality of driving sources, and each of the driving sources is correspondingly disposed on one side of each of the driving gates away from each of the driving active parts; wherein, in each of the driving transistors, the driving source is electrically connected to the first conductive subsection, and an orthographic projection of the channel subsection on the substrate is within a coverage range of an orthographic projection of the driving source on the substrate.

In an embodiment of the present disclosure, the second metal layer further includes a plurality of driving drains, and each of the driving drains is correspondingly disposed on one side of each of the driving gates away from each of the driving active parts and is electrically connected to the second conductive subsection.

In an embodiment of the present disclosure, the display panel further includes a third metal layer disposed on one side of the first metal layer away from the substrate and on a different layer from the second metal layer, wherein, the third metal layer includes a plurality of driving drains, and each of the driving drains is correspondingly disposed on one side of each of the driving gates away from each of the driving active parts and is electrically connected to the second conductive subsection.

In an embodiment of the present disclosure, the third metal layer is disposed on one side of the second metal layer away from the active layer, and the third metal layer further includes first power signal lines and a plurality of first electrode elements; and each of the first electrode elements is electrically connected to each of the driving sources, one end of each of the driving drains is connected to the second conductive subsection, and another end of each of the driving drains is connected to the first power signal lines.

In an embodiment of the present disclosure, the second metal layer is disposed on one side of the third metal layer away from the active layer, the second metal layer further includes a plurality of first electrode elements, and each of the first electrode elements is electrically connected to each of the driving sources; and wherein, one end of each of the driving sources is connected to the first conductive subsection of each of the driving active parts, and another end of each of the driving sources is connected to each of the first electrode elements.

In an embodiment of the present disclosure, the display panel further includes a plurality of switch transistors, wherein, each of the switch transistors is electrically connected to each of the driving transistors and includes a switch active part, a switch gate, and a switch source and a switch drain connected to the switch active part;

wherein, the active layer includes a plurality of switch active parts, the first metal layer includes a plurality of switch gates, and the second metal layer includes a plurality of switch sources, a plurality of switch drains, and a plurality of scan lines; and each of the switch gates is correspondingly disposed on one side of each of the switch active parts away from the substrate, and each of the scan lines is correspondingly disposed on one side of each of the switch gates away from each of the switch active parts.

According to the above objectives of the present disclosure, an embodiment of the present disclosure further provides a manufacturing method of a display panel, wherein, the display panel includes a plurality of driving transistors, and each of the driving transistors includes a driving active part, a driving gate, and a driving source and a driving drain connected to the driving active part;

wherein, the manufacturing method of the display panel includes following steps:

providing a substrate;

disposing an active layer formed with a plurality of driving active parts on one side of the substrate, and conductorizing each of the driving active parts to allow each of the driving active parts to be formed with a first conductive subsection and a second conductive subsection spaced apart from each other, and a channel subsection connected between the first conductive subsection and the second conductive subsection; and disposing a first metal layer on one side of the active layer away from the substrate, wherein, the first metal layer is formed with a plurality of driving gates, and each of the driving gates is correspondingly disposed on one side of each of the driving active parts away from the substrate; wherein, a length of the channel subsection in a first direction is less than a length of the driving gates in the first direction, and the first direction is a direction in which the first conductive subsection points to the second conductive subsection.

According to the objectives of the present disclosure, an embodiment of the present disclosure further provides a display device, which includes a display panel and a device body, and the display panel and the device body are an integrated structure.

Beneficial effects of the present disclosure: in current technology, in a top gate structure, active layers are shielded by gates for conductive treatments to form channels and conductive portions on both sides of the channels, and a channel length is determined by a length of the gates, generally being equal to the length of the gates. Compared to the current technology, in the present disclosure, the length of the channel subsection of each driving active part is less than the length of the driving gates, so the driving transistors having a short channel can be realized, thereby effectively improving a current-passing capacity of the driving transistors. In addition, the driving gates of the present disclosure are disposed on one side of the driving active parts away from the substrate, thereby further preventing ions in film layers on one side of the driving gates away from the driving active parts from diffusing into the driving active parts and affecting electrical properties of the driving active parts. Therefore, stability and a driving effect of the driving transistors can be improved.

DESCRIPTION OF DRAWINGS

The technical solutions and other beneficial effects of the present disclosure will be made obvious by describing the specific embodiments of the present disclosure in detail in conjunction with the accompanying drawings.

FIG. 9 is a flowchart of a manufacturing method of the display panel according to an embodiment of the present disclosure.

DETAILED DESCRIPTION OF PREFERRED EMBODIMENTS

Figure 1:
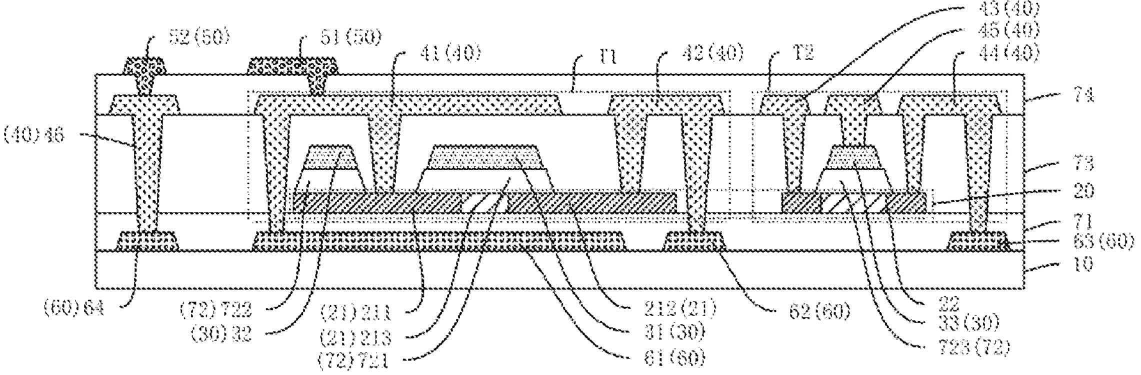
FIG. 1 is a first schematic structural diagram of a display panel according to an embodiment of the present disclosure.

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

The following disclosure provides many different embodiments or examples for realizing different structures of the present disclosure. In order to simplify the present disclosure, the components and settings of a specific example are described below. Of course, they are merely examples and are not intended to limit the present disclosure. In addition, the present disclosure may repeat reference numerals and/or reference letters in different examples, which are for the purpose of simplicity and clarity, and do not indicate the relationship between the various embodiments and/or arrangements discussed. In addition, the present disclosure provides examples of various specific processes and materials, but one of ordinary skill in the art will recognize the use of other processes and/or the use of other materials.

An embodiment of the present disclosure provides a display panel. Referring to FIG. 1, the display panel includes a plurality of driving transistors T1. Each of the driving transistors T1 includes a driving active part 21, a driving gate 31, and a driving source 41 and a driving drain 42 connected to the driving active part 21.

Further, the display panel further includes a substrate 10, an active layer 20, and a first metal layer 30. The active layer 20 is disposed on one side of the substrate 10 and includes a plurality of driving active parts 21. The first metal layer 30 is disposed on one side of the active layer 20 away from the substrate 10 and includes a plurality of driving gates 31, and each of the driving gates 31 is correspondingly located on one side of each of the driving active parts 21 away from the substrate 10.

Wherein, each of the driving active parts 21 includes a first conductive subsection 211 and a second conductive subsection 212 spaced apart from each other, and a channel subsection 213 connected between the first conductive subsection 211 and the second conductive subsection 213. A size of the channel subsection 213 in a first direction is less than a size of the driving gates 31 in the first direction, and the first direction is a direction in which the first conductive subsection 211 points to the second conductive subsection 212.

During practical applications, in current technology, in a top gate structure, active layers are shielded by gates for conductive treatments to form channels and conductive portions on both sides of the channels, and a channel length is determined by a length of the gates, generally being equal to the length of the gates. However, compared to the current technology, in the embodiment of the present disclosure, a length of the channel subsection 213 of each driving active part 21 is less than a length of the driving gates 31, so the driving transistors T1 having a short channel can be realized, thereby effectively improving a current-passing capacity of the driving transistors T1. In addition, the driving gates 31 of the present disclosure are disposed on one side of the driving active parts 21 away from the substrate 10, thereby further preventing ions in film layers on one side of the driving gates 31 away from the driving active parts 21 from diffusing into the driving active parts 21 and affecting electrical properties of the driving active parts 21. Therefore, stability and a driving effect of the driving transistors T1 can be improved.

Specifically, referring to FIG. 1, in an embodiment of the present disclosure, the display panel includes the plurality of driving transistors T1 and a plurality of switch transistors T2, and each of the driving transistors T1 is electrically connected to each of the switch transistors T2. It should be noted that each of the driving transistors T1 includes the driving active part 21, the driving gate 31, and the driving source 41 and the driving drain 42 connected to the driving active part 21. Each of the switch transistors T2 includes a switch active part 22, a switch gate 33, and a switch source 43 and a switch drain 44 connected to the switch active part 22.

Further, the display panel further includes the substrate 10, a fourth metal layer 60 disposed on the substrate 10, a buffer layer 71 disposed on the substrate 10 and covering the fourth metal layer 60, the active layer 20 disposed on the buffer layer 71, a gate insulating layer 72 disposed on the active layer 20, the first metal layer 30 disposed on the gate insulating layer 72, an interlayer dielectric layer 73 disposed on the buffer layer 71 and covering the active layer 20, the gate insulating layer 72, and the first metal layer 30, a second metal layer 40 disposed on the interlayer dielectric layer 73, a passivation layer 74 disposed on the interlayer dielectric layer 73 and covering the second metal layer 40, and a third metal layer 50 disposed on the passivation layer 74.

Wherein, the fourth metal layer 60 includes a plurality of light-shielding parts 61, first power signal lines 62, data lines 63, and second power signal lines 64 disposed on the substrate 10.

The active layer 20 includes the plurality of driving active parts 21 and a plurality of switch active parts 22, and each driving active part 21 is correspondingly disposed on each light-shielding part 61.

The gate insulating layer 72 includes a first insulating part 721 and a second insulating part 722 disposed on each of the driving active parts 21, and a third insulating part 723 disposed on each of the switch active parts 22.

The first metal layer 30 includes the driving gates 31 disposed on first insulating parts 721, storage electrode elements 32 disposed on second insulating parts 722, and switch gates 33 disposed on third insulating parts 723.

The second metal layer 40 includes a plurality of driving sources 41, a plurality of driving drains 42, a plurality of switch sources 43, a plurality of switch drains 44, a plurality of scan lines 45, and a plurality of connecting parts 46. Wherein, each driving source 41 and each driving drain 42 are correspondingly disposed on one side of each driving gate 31 and each storage electrode element 32 away from each driving active part 21, and each switch source 43 and each switch drain 44 are disposed on one side of each switch gate 33 away from each switch active part 22. That is, one driving source 41, one driving drain 42, one driving gate 31, and one driving active part 21 constitute one driving transistor T1, and one switch source 43, one switch drain 44, one switch gate 33, and one switch active part 22 constitute one switch transistor T2. Wherein, in one driving transistor T1, the driving source 41 and the driving drain 42 penetrate through the interlayer dielectric layer 73 to be connected to both sides of the driving active part 21.

In addition, the driving source 41 further penetrates through the interlayer dielectric layer 73 and the buffer layer 71 to be connected to one of the light-shielding parts 61, thereby providing a stable voltage for the light-shielding part 61 and improving a saturation characteristic of an output characteristic curve of the driving transistors T1.

Each scan line 45 is correspondingly located on one switch transistor T2 and is between the switch source 43 and the switch drain 44 of a corresponding switch transistor T2, and each scan line 45 is located on one side of a corresponding switch gate 33 away from a corresponding switch active part 22. In the embodiment of the present disclosure, the scan lines 45 are disposed on the switch gates 33, so that the scan lines 45 and the switch gates 33 can together block hydrogen ions in upper film layers or in the environment from diffusing into the switch active parts 22, thereby improving electrical properties and stability of the switch active parts 22.

The third metal layer 50 includes a plurality of first electrode elements 51 and a plurality of second electrode elements 52, each first electrode element 51 passes through the passivation layer 74 and is connected to a corresponding driving source 41, each second electrode element 52 passes through the passivation layer 74 and is connected to a corresponding connecting part 46, and each connecting part 46 passes through the interlayer dielectric layer 73 and the buffer layer 71 and is connected to a corresponding second power signal line 64.

Figure 2:
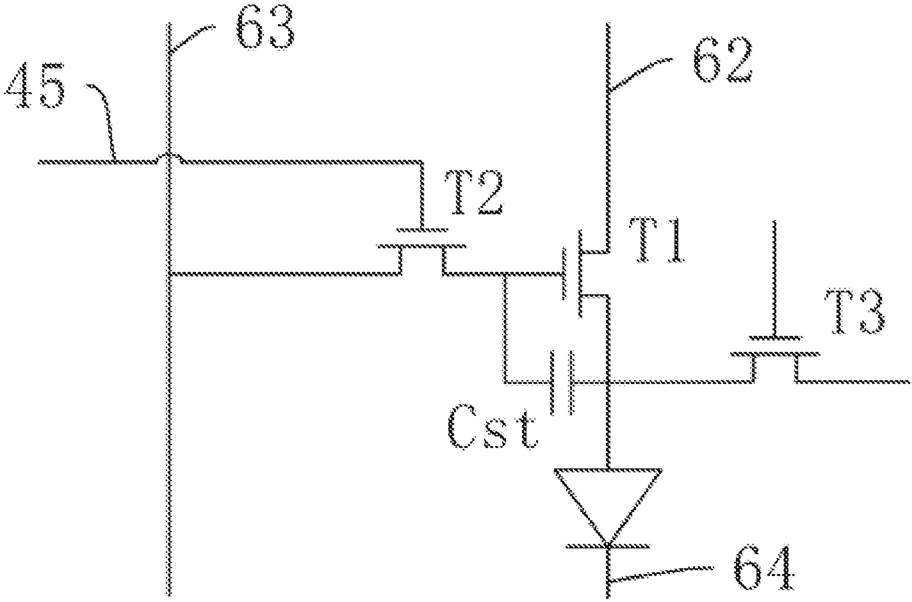
FIG. 2 is a schematic circuit diagram of a 3T1C pixel driving circuit according to an embodiment of the present disclosure.

Further, a circuit connection structure of the driving transistors T1 and the switch transistors T2 in the embodiments of the present disclosure will be described below. Referring to FIG. 1 and FIG. 2, a pixel driving circuit of a 3T1C architecture can be applied to the display panel provided by the embodiments of the present disclosure.

Specifically, the switch drain 44 of one switch transistor T2 is connected to one of the data lines 63, the switch source 43 thereof is connected to the driving gate 31 of one driving transistor T1, and the switch gate 33 thereof is connected to one of the scan lines 45. The driving drain 42 of the driving transistor T1 is connected to one of the first power signal lines 62, and the driving source 41 thereof is connected to one of the first electrode elements 51, thereby transmitting electrical signals in the first power signal lines 62 to the first electrode elements 51. The display panel further includes sense transistors T3, a gate of one sense transistor T3 is connected to a sensing signal line, a source of the sense transistor T3 is connected to the driving source 41 of the driving transistor T1, and a drain of the sense transistor T3 may be connected to a detective module, thereby detecting an actual value of a current that passes the first electrode elements 51 and generating a compensation voltage. The second power signal lines 64 transmit the electrical signals to the second electrode elements 52 by the connecting parts 46. The above process may work with reference to a principle of the pixel driving circuit of a conventional 3T1C, and is not repeated herein.

It should be noted that in the embodiments of the present disclosure, positions of the driving source 41 and the driving drain 42 may be interchanged, and positions of the switch source 43 and the switch drain 44 may also be interchanged, which may be selected according to actual needs and are not limited here.

The display panel provided by the embodiments of the present disclosure may be used for OLED displays, micro-LED displays, and mini-LED displays. When the display panel is used for an OLED display, the first electrode elements 51 may be anodes in OLED light-emitting devices, and the second electrode elements 52 may be signal terminals in a non-display area of the display panel and are connected to cathodes in the OLED light-emitting devices. When the display panel is used for a micro-LED display or a mini-LED display, the first electrode elements 51 may be connected to positive electrodes of LED chips, and the second electrode elements 52 may be connected to negative electrodes of the LED chips.

In the embodiments of the present disclosure, each of the driving active parts 21 includes the first conductive subsection 211 and the second conductive subsection 212 that are spaced apart from each other, and the channel subsection 213 connected between the first conductive subsection 211 and the second conductive subsection 213. Wherein, the length of the channel subsection 213 in the first direction is less than the length of the driving gates 31 in the first direction, and the first direction is the direction in which the first conductive subsection 211 points to the second conductive subsection 212. That is, the embodiments of the present disclosure can realize the driving transistors T1 having the short channel, thereby effectively improving the current-passing capacity of the driving transistors T1.

Specifically, in each of the driving transistors T1, an orthographic projection of the channel subsection 213 on the substrate 10 is within a coverage range of an orthographic projection of the driving gate 31 on the substrate 10, and an orthographic projection of the first conductive subsection 211 on the substrate 10 and an orthographic projection of the second conductive subsection 212 on the substrate 10 all partially overlap with the orthographic projection of the driving gate 31 on the substrate 10. That is, the driving gate 31 can completely cover the channel subsection 213, so that the hydrogen ions in film layers on one side of the driving gate 31 away from the active layer 20 or the hydrogen ions in the environment can be prevented from diffusing into the channel subsection 213, thereby improving electrical properties and stability of the driving active parts 21.

It should be noted that in the top gate structure of the current technology, when the active layers are shielded by the gates for conductive treatments, process fluctuations or errors will cause the conductive portions of the active layers to partially overlap the gates, but a length of an overlapping portion thereof is within 0.25 μm. In the embodiments of the present disclosure, in the first direction, a length of an overlapping portion between the orthographic projection of the first conductive subsection 211 on the substrate 10 and the orthographic projection of the driving gate 31 on the substrate 10, and a length of an overlapping portion between the orthographic projection of the second conductive subsection 212 on the substrate 10 and the orthographic projection of the driving gate 31 on the substrate 10 are all greater than or equal to 0.25 μm. Therefore, the length of the channel subsection 213 can be effectively reduced, thereby increasing the current-passing capacity of the driving transistors T1.

Optionally, a distance from a boundary of the orthographic projection of the channel subsection 213 on the substrate 10 to a boundary of the orthographic projection of the driving gate 31 on the substrate 10 may be greater than or equal to 2.5 μm, and a length of the channel subsection 213 in the first direction may be less than or equal to 2.5 μm.

Preferably, the distance from the boundary of the orthographic projection of the channel subsection 213 on the substrate 10 to the boundary of the orthographic projection of the driving gate 31 on the substrate 10 may be greater than or equal to 2.75 μm, and the length of the channel subsection 213 in the first direction may be less than or equal to 2.5 μm and greater than or equal to 2 μm.

Please refer to the following current formula:

$$Ids = \frac{W}{L} * Cox * u * (Vgs - Vth).$$

Wherein, W is an effective channel width of a transistor, L is an effective channel length of the transistor, Cox is a capacitance of a gate insulating layer, u is mobility, Vgs is a gate voltage of the transistor, and Vth is a threshold voltage of the transistor. Compared to current technology, a channel length in current technology is generally about 8 μm, while in the embodiments of the present disclosure, the length of the channel subsection 213 can be reduced to within 2.5 μm, thereby the current-passing capacity of the driving transistors T1 of the present disclosure can be increased by 220% to 300%.

In embodiments of the present disclosure, the first conductive subsection 211 and the second conductive subsection 212 are located on opposite sides of the driving active part 21, the driving source 41 is electrically connected to the first conductive subsection 211 through the interlayer dielectric layer 73, and the driving drain 42 is electrically connected to the second conductive subsection 212 through the interlayer dielectric layer 73.

It should be noted that in conjunction with FIGS. 1 and 2, each storage electrode element 32 is disposed on one side of one corresponding driving active part 21 away from the substrate 10. Specifically, the storage electrode element 32 is located on one side of the first conductive subsection 211 away from the substrate 10, that is, the storage electrode element 32 is disposed opposite to the first conductive subsection 211 to constitute a storage capacitor Cst. In the embodiment of the present disclosure, the first conductive subsection 211 is used as a lower plate of the storage capacitor Cst, a metal of a same layer as the driving gate 31 and the switch gate 33 is used to prepare an upper plate of the storage capacitor Cst, and the gate insulating layer 72 is used for an interval in the middle. Since a thickness of the gate insulating layer 72 is thin, the capacitance of the formed storage capacitor Cst is relatively large, so that an area of the upper and lower plates can be reduced. That is, an area of the storage electrode element 32 can be reduced, which is beneficial to reducing an occupied space of the pixel driving circuit, thereby improving the resolution of the display panel.

It can be understood that if the positions of the driving source 41 and the driving drain 42 are interchanged, that is, the driving source 41 is connected to the first power signal line 62, and the driving drain 42 is connected to the first electrode element 51, and the driving source 41 is electrically connected to the first conductive subsection 211, and the driving drain 42 is electrically connected to the second conductive subsection 212, then the storage electrode element 32 is disposed opposite to the second conductive subsection 212.

Further, in this embodiment, the driving source 41 extends toward a direction adjacent to the driving drain 42. That is, the orthographic projection of the channel subsection 213 on the substrate 10 is within a coverage range of an orthographic projection of the driving source 41 on the substrate 10. Therefore, a double occlusion of the driving gate 31 and the driving source 41 can be formed on the channel subsection 213, so that the hydrogen ions in film layers on one side of the driving gate 31 and the driving source 41 away from the substrate 10 or the hydrogen ions in the environment can be further prevented from diffusing into the channel subsection 213 of the driving active part 21, thereby improving the electrical properties and stability of the driving active parts 21 and the driving transistors T1.

In addition, in the embodiment, the length of the channel subsection 213 of each driving active part 21 is less than the length of the driving gates 31, so the driving transistors T1 having the short channel can be realized, thereby effectively improving the current-passing capacity of the driving transistors T1. In addition, the driving gates 31 of the present disclosure are disposed on the side of the driving active parts 21 away from the substrate 10, and the driving source 41 covers the channel subsection 213 of the driving active part 21, thereby further preventing the ions in the film layers on one side of the driving gates 31 away from the driving active parts 21 from diffusing into the driving active parts 21 and affecting the electrical properties of the driving active parts 21, and preventing water vapor from intruding into the driving transistors T1. Therefore, the stability and the driving effect of the driving transistors T1 can be improved.

Figure 3:
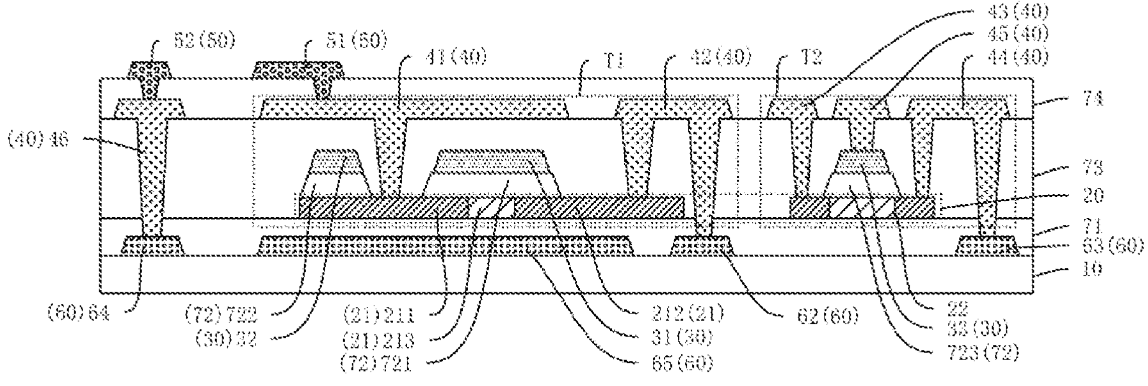
FIG. 3 is a second schematic structural diagram of the display panel according to an embodiment of the present disclosure.

In another embodiment of the present disclosure, referring to FIG. 3, a difference between this embodiment and the previous embodiment is that the fourth metal layer 60 includes a plurality of driving bottom gates 65, the first power signal lines 62, the data lines 63, and the second power signal lines 64. Each driving bottom gate 65 is correspondingly disposed under each driving active part 21 to from the driving transistors T1 with a double-gate structure.

Optionally, the driving bottom gate 65 and the driving gate 31 may be at a same electrical potential.

In addition, in the embodiment, the length of the channel subsection 213 of each driving active part 21 is less than the length of the driving gates 31, so the driving transistors T1 having the short channel can be realized, thereby effectively improving the current-passing capacity of the driving transistors T1. In addition, the driving gates 31 of the present disclosure are disposed on the side of the driving active parts 21 away from the substrate 10, and the driving source 41 covers the channel subsection 213 of the driving active part 21, thereby further preventing the ions in the film layers on one side of the driving gates 31 away from the driving active parts 21 from diffusing into the driving active parts 21 and affecting the electrical properties of the driving active parts 21, and preventing water vapor from intruding into the driving transistors T1. Therefore, the stability and the driving effect of the driving transistors T1 can be improved.

Figure 4:
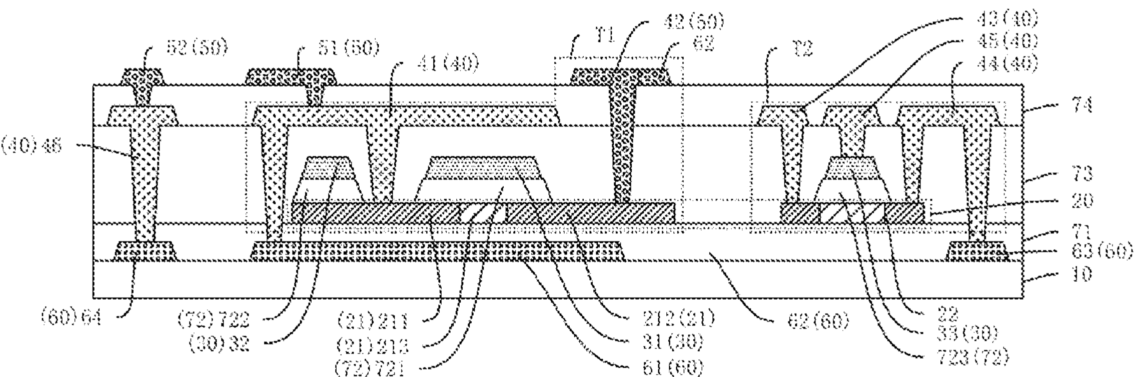
FIG. 4 is a third schematic structural diagram of the display panel according to an embodiment of the present disclosure.

In another embodiment of the present disclosure, referring to FIG. 4, a difference between this embodiment and the first embodiment is that in this embodiment, the second metal layer 40 includes the driving sources 41, the switch sources 43, the switch drains 44, the scan lines 45, and the connecting parts 46, and the third metal layer 50 includes the first electrode elements 51, the second electrode elements 52, and the driving drains 42. That is, in this embodiment, the driving drains 42 are prepared in the third metal layer 50 which is a different layer from the driving sources 41.

In addition, in this embodiment, the first power signal lines 62 may also be disposed in the third metal layer 50 and formed integrally with the driving drains 42. That is, one end of the driving drains 42 is connected to the second conductive subsection 212, and another end thereof is connected to the first power signal lines 62.

In this embodiment, the driving source 41 extends in the direction of the driving drain 42 to cover the channel subsection 213. However, in order to prevent signal interference and short circuits, it is necessary to separate the driving source 41 and the driving drain 42. In the first embodiment, the driving source 41 and the driving drain 42 are arranged in the same layer, so that a distance between the driving source 41 and the driving drain 42 needs to be at least 6 μm. In this embodiment, the driving drain 42 is prepared on the third metal layer 50 which is the different layer from the driving source 41, thereby a distance between the driving source 41 and the driving drain 42 in the first direction can be reduced.

Optionally, the distance between the driving source 41 and the driving drain 42 in the first direction may be greater than or equal to 2 μm, and less than or equal to 3 μm.

Figure 8:
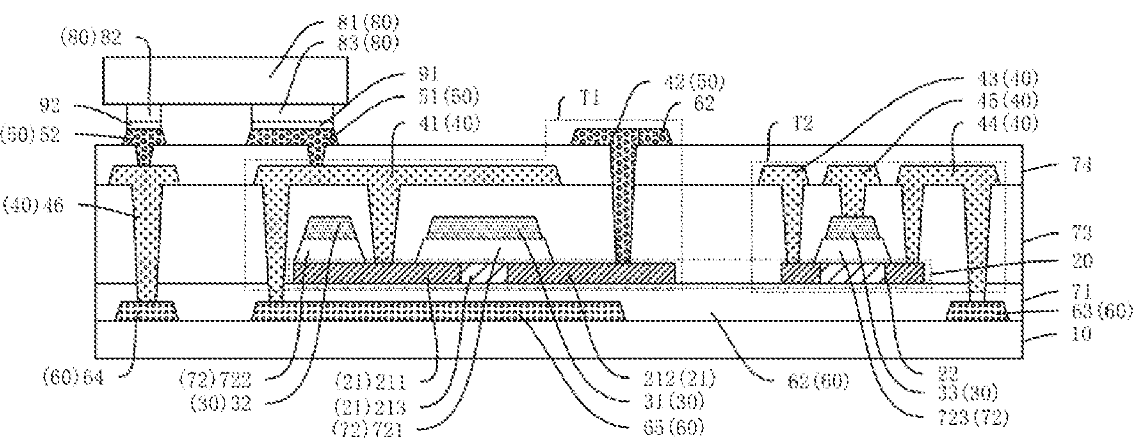
FIG. 8 is a seventh schematic structural diagram of the display panel according to an embodiment of the present disclosure.

Further, referring to FIG. 8, when the display panel provided in the embodiments is used for the micro-LED display or the mini-LED display, the display panel may include LED lighting devices 80. Each LED lighting device 80 includes an LED body 81, and a positive electrode 83 and a negative electrode 82 connected to the LED body 81. Wherein, the positive electrode 83 may be connected to one of the first electrode elements 51 by one first connection part 91, and the negative electrode 82 may be connected to one of the second electrode elements 52 by one second connection part 92. Therefore, signals in the first power signal lines 62 can be transmitted to the positive electrode 83 and signals in the second power signal lines 64 can be transmitted to the negative electrode 82 by the driving transistors T1.

In addition, in the embodiment, the length of the channel subsection 213 of each driving active part 21 is less than the length of the driving gates 31, so the driving transistors T1 having the short channel can be realized, thereby effectively improving the current-passing capacity of the driving transistors T1. In addition, the driving gates 31 of the present disclosure are disposed on the side of the driving active parts 21 away from the substrate 10, and the driving source 41 covers the channel subsection 213 of the driving active part 21, thereby further preventing the ions in the film layers on one side of the driving gates 31 away from the driving active parts 21 from diffusing into the driving active parts 21 and affecting the electrical properties of the driving active parts 21, and preventing water vapor from intruding into the driving transistors T1. Therefore, the stability and the driving effect of the driving transistors T1 can be improved. Compared to the first embodiment, this embodiment can reduce the distance between the driving source 41 and the driving drain 42 in the first direction, thereby further reducing the probability of water vapor intruding into the driving transistors T1 from upper layers and further blocking the hydrogen ions in the upper film layers and in the environment from diffusing into the channel subsection 213. Therefore, a weather resistance and stability of the driving transistors T1 can be improved, a size of the driving transistors T1 can be reduced, and the display panel having a higher resolution can be realized.

Figure 5:
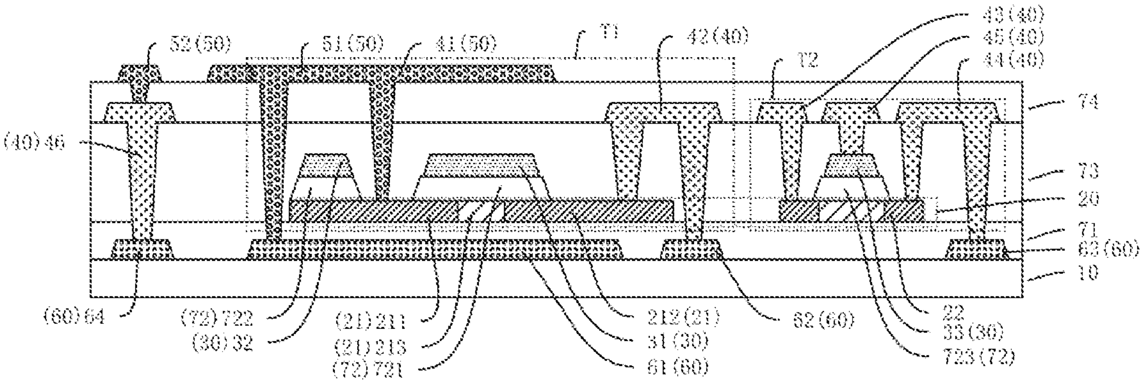
FIG. 5 is a fourth schematic structural diagram of the display panel according to an embodiment of the present disclosure.

In another embodiment of the present disclosure, referring to FIG. 5, a difference between this embodiment and the first embodiment is that in this embodiment, the second metal layer 40 includes the driving drains 42, the switch sources 43, the switch drains 44, the scan lines 45, and the connecting parts 46, and the third metal layer 50 includes the first electrode elements 51, the second electrode elements 52, and the driving sources 41. That is, in this embodiment, the driving drains 42 are prepared in the third metal layer 50 which is a different layer from the driving sources 41.

In this embodiment, the driving source 41 extends in the direction of the driving drain 42 to cover the channel subsection 213. However, in order to prevent signal interference and short circuits, it is necessary to separate the driving source 41 and the driving drain 42. In the first embodiment, the driving source 41 and the driving drain 42 are arranged in the same layer, so that a distance between the driving source 41 and the driving drain 42 needs to be at least 6 μm. In this embodiment, the driving source 41 is prepared on the third metal layer 50 which is the different layer from the driving drain 42, thereby a distance between the driving source 41 and the driving drain 42 in the first direction can be reduced.

Optionally, the distance between the driving source 41 and the driving drain 42 in the first direction may be greater than or equal to 2 μm, and less than or equal to 3 μm.

In addition, in this embodiment, the third metal layer 50 includes the first electrode elements 51, the second electrode elements 52, and the driving sources 41. Wherein, one end of the driving sources 41 is connected to the first conductive subsection 211 of one corresponding driving active part 21, and another end thereof is connected to one of the first electrode elements 51. That is, in this embodiment, the driving sources 41 may be integrally formed with the first electrode elements 51.

In addition, in the embodiment, the length of the channel subsection 213 of each driving active part 21 is less than the length of the driving gates 31, so the driving transistors T1 having the short channel can be realized, thereby effectively improving the current-passing capacity of the driving transistors T1. In addition, the driving gates 31 of the present disclosure are disposed on the side of the driving active parts 21 away from the substrate 10, and the driving source 41 covers the channel subsection 213 of the driving active part 21, thereby further preventing the ions in the film layers on one side of the driving gates 31 away from the driving active parts 21 from diffusing into the driving active parts 21 and affecting the electrical properties of the driving active parts 21, and preventing water vapor from intruding into the driving transistors T1. Therefore, the stability and the driving effect of the driving transistors T1 can be improved. Compared to the first embodiment, this embodiment can reduce the distance between the driving source 41 and the driving drain 42 in the first direction, thereby further reducing the probability of water vapor intruding into the driving transistors T1 from upper layers and further blocking the hydrogen ions in the upper film layers and in the environment from diffusing into the channel subsection 213. Therefore, the weather resistance and stability of the driving transistors T1 can be improved, the size of the driving transistors T1 can be reduced, and the display panel having the higher resolution can be realized.

Figure 6:
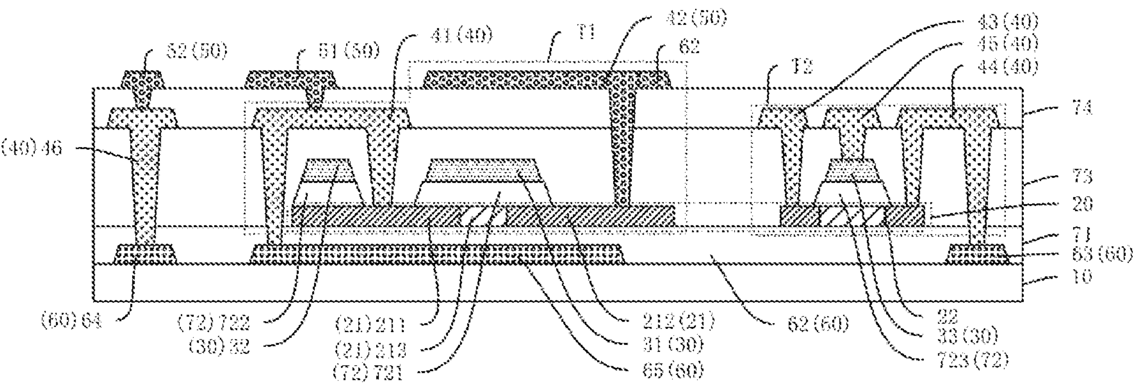
FIG. 6 is a fifth schematic structural diagram of the display panel according to an embodiment of the present disclosure.

In another embodiment of the present disclosure, referring to FIG. 6, a difference between this embodiment and the third embodiment is that in this embodiment, the driving drain 42 extends in the direction adjacent to the driving source 41 and covers the channel subsection 213. That is, the orthographic projection of the channel subsection 213 on the substrate 10 is within a coverage range of an orthographic projection of the driving drain 42 on the substrate 10.

In addition, in this embodiment, the first power signal lines 62 may also be disposed in the third metal layer 50 and formed integrally with the driving drains 42.

In addition, in the embodiment, the length of the channel subsection 213 of each driving active part 21 is less than the length of the driving gates 31, so the driving transistors T1 having the short channel can be realized, thereby effectively improving the current-passing capacity of the driving transistors T1. In addition, the driving gates 31 of the present disclosure are disposed on the side of the driving active parts 21 away from the substrate 10, and the driving drain 42 covers the channel subsection 213 of the driving active part 21, thereby further preventing the ions in the film layers on one side of the driving gates 31 away from the driving active parts 21 from diffusing into the driving active parts 21 and affecting the electrical properties of the driving active parts 21, and preventing water vapor from intruding into the driving transistors T1. Therefore, the stability and the driving effect of the driving transistors T1 can be improved. In this embodiment, the driving source 41 and the driving drain 42 are disposed in different layers, which can reduce the distance between the driving source 41 and the driving drain 42 in the first direction, thereby further reducing the probability of water vapor intruding into the driving transistors T1 from upper layers and further blocking the hydrogen ions in the upper film layers and in the environment from diffusing into the channel subsection 213. Therefore, the weather resistance and stability of the driving transistors T1 can be improved, the size of the driving transistors T1 can be reduced, and the display panel having the higher resolution can be realized.

Figure 7:
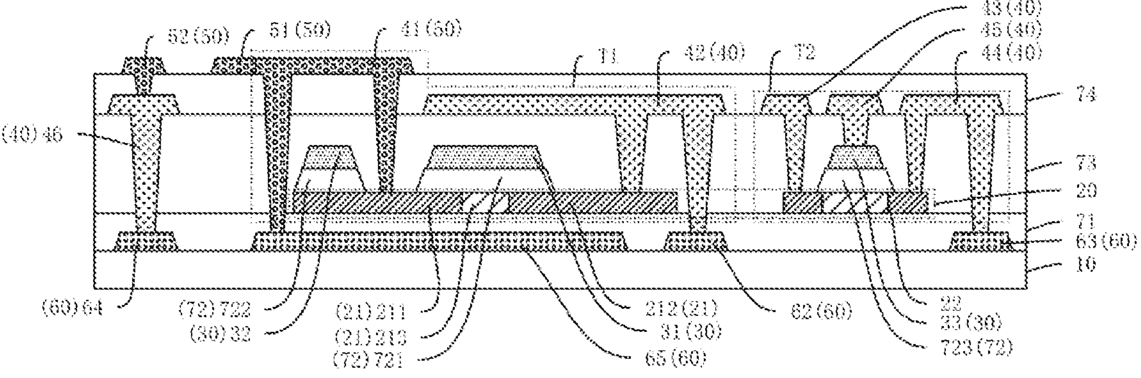
FIG. 7 is a sixth schematic structural diagram of the display panel according to an embodiment of the present disclosure.

In another embodiment of the present disclosure, referring to FIG. 7, a difference between this embodiment and the fourth embodiment is that in this embodiment, the driving drain 42 extends in the direction adjacent to the driving source 41 and covers the channel subsection 213. That is, the orthographic projection of the channel subsection 213 on the substrate 10 is within a coverage range of an orthographic projection of the driving drain 42 on the substrate 10.

In addition, in this embodiment, the third metal layer 50 includes the first electrode elements 51, the second electrode elements 52, and the driving sources 41. Wherein, one end of the driving sources 41 is connected to the first conductive subsection 211 of one corresponding driving active part 21, and another end thereof is connected to one of the first electrode elements 51. That is, in this embodiment, the driving sources 41 may be integrally formed with the first electrode elements 51.

In addition, in the embodiment, the length of the channel subsection 213 of each driving active part 21 is less than the length of the driving gates 31, so the driving transistors T1 having the short channel can be realized, thereby effectively improving the current-passing capacity of the driving transistors T1. In addition, the driving gates 31 of the present disclosure are disposed on the side of the driving active parts 21 away from the substrate 10, and the driving drain 42 covers the channel subsection 213 of the driving active part 21, thereby further preventing the ions in the film layers on one side of the driving gates 31 away from the driving active parts 21 from diffusing into the driving active parts 21 and affecting the electrical properties of the driving active parts 21, and preventing water vapor from intruding into the driving transistors T1. Therefore, the stability and the driving effect of the driving transistors T1 can be improved. In this embodiment, the driving source 41 and the driving drain 42 are disposed in different layers, which can reduce the distance between the driving source 41 and the driving drain 42 in the first direction, thereby further reducing the probability of water vapor intruding into the driving transistors T1 from upper layers and further blocking the hydrogen ions in the upper film layers and in the environment from diffusing into the channel subsection 213. Therefore, the weather resistance and stability of the driving transistors T1 can be improved, the size of the driving transistors T1 can be reduced, and the display panel having the higher resolution can be realized.

Correspondingly, an embodiment of the present disclosure further provides a manufacturing method of the display panel mentioned above. In conjunction with FIGS. 1 and 9, the display panel includes the plurality of driving transistors T1. Each of the driving transistors T1 includes the driving active part 21, the driving gate 31, and the driving source 41 and the driving drain 42 connected to the driving active part 21.

The manufacturing method of the display panel includes following steps.

S10: providing the substrate 10.

S20: disposing the active layer 20 formed with the plurality of driving active parts 21 on one side of the substrate 10, and conductorizing each of the driving active parts 21 to allow each of the driving active parts 21 to be formed with the first conductive subsection 211 and the second conductive subsection 212 spaced apart from each other, and the channel subsection 213 connected between the first conductive subsection 211 and the second conductive subsection 212.

S30: disposing the first metal layer 30 on one side of the active layer 20 away from the substrate 10, wherein, the first metal layer 30 is formed with the plurality of driving gates 31, and each of the driving gates 31 is correspondingly disposed on one side of each of the driving active parts 21 away from the substrate 10. Wherein, the length of the channel subsection 213 in the first direction is less than the length of the driving gates 31 in the first direction, and the first direction is the direction in which the first conductive subsection 211 points to the second conductive subsection 212.

In an embodiment of the present disclosure, referring to FIGS. 1, 9, and 10A to 10G. The manufacturing method of the display panel includes following steps.

Providing the substrate 10, wherein, the substrate 10 may be a glass substrate or a flexible polyimide substrate, which is not limited herein.

Forming a first metal material layer on the substrate 10, and patterning the first metal material layer to obtain the fourth metal layer 60. The fourth metal layer 60 includes the plurality of light-shielding parts 61, first power signal lines 62, data lines 63, and second power signal lines 64.

Optionally, a material of the first metal material layer may include Mo, Mo/Al, Mo/Cu, MoTi/Cu, IZO/Cu, Mo/Cu/MoTiNi, Ni/Cu/Ni, MoTiNi/Cu/MoTiNi, NiCr/Cu/NiCr, or CuNb.

Figure 10A:
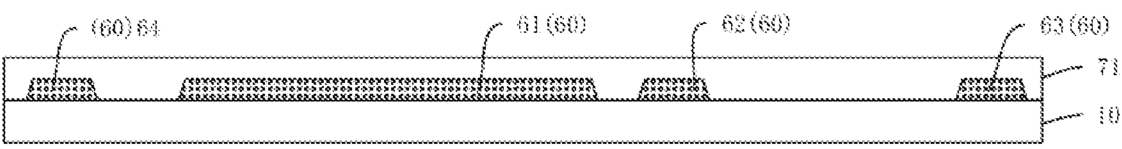
FIGS. 10A to 10G are schematic structural diagrams of the display panel during manufacturing steps.

Forming the buffer layer 71 on the third metal layer 50, wherein, the buffer layer 71 covers the light-shielding parts 61, the first power signal lines 62, the data lines 63, and the second power signal lines 64, as shown in FIG. 10A.

Optionally, a material of the buffer layer 71 may include SiOx, SiNx, SiNx/SiOx, or SiNOx.

Figure 10B:
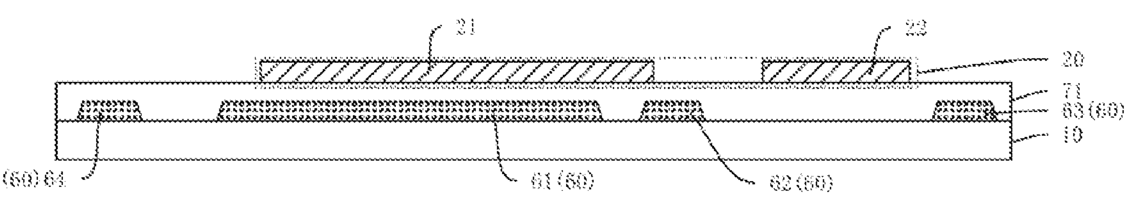

Forming a semiconductor material layer on the buffer layer 71, and patterning the semiconductor material layer to form the active layer 20. The active layer 20 includes the plurality of driving active parts 21 and the plurality of switch active parts 22, and each driving active part 21 is correspondingly located above one light-shielding part 61, as shown in FIG. 10B.

Figure 10C:
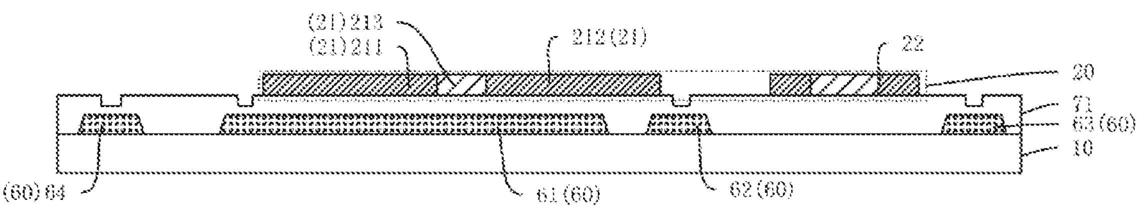

Specifically, the conductive treatment performed on each driving active part 21 may using He ion, Ar ion, or $NH_3$ ion for plasma treatment to form the first conductive subsection 211 and the second conductive subsection 212 spaced apart from each other, and the channel subsection 213 connected between the first conductive subsection 211 and the second conductive subsection 213. The buffer layer 71 is patterned to form a plurality of first vias corresponding to the light-shielding parts 61, the first power signal lines 62, the data lines 63, and the second power signal lines 64, and each first via only penetrates a part of the buffer layer 71, as shown in FIG. 10C.

Optionally, a material of the semiconductor material layer may include at least one of IGZO, IGTO, IGZO, IGO, IZO, or AIZO.

It can be understood that in this embodiment, after the driving active parts 21 are formed, the conductive treatment is directly performed on the driving active parts 21. Therefore, in the current technology, in the top gate structure, the active layers are shielded by the gates for conductive treatments to form channels and conductive portions on both sides of the channels, and the channel length is determined by the length of the gates, generally being equal to the length of the gates. However, compared to the current technology, in the embodiment of the present disclosure, the length of the channel subsection 213 of each driving active part 21 is not affected by the length of the driving gates 31 and may be less than the length of the driving gates 31, so the driving transistors T1 having the short channel can be realized, thereby effectively improving the current-passing capacity of the driving transistors T1.

Optionally, the length of the channel subsection 213 in the first direction may be less than or equal to 2.5 μm, and the first direction is the direction in which the first conductive subsection 211 points to the second conductive subsection 212.

Forming an insulating material layer on the active layer 20 and then forming a gate metal layer on the insulating material layer.

Optionally, a material of the insulating material layer may include SiOx, SiNx, $Al_2O_3$/SiNx/SiOx, or SiOx/SiNx/SiOx. A material of the gate metal layer may include Mo, Mo/Al, Mo/Cu, Mo/Cu/IZO, IZO/Cu/IZO, Mo/Cu/ITO, Ni/Cu/Ni, MoTiNi/Cu/MoTiNi, NiCr/Cu/NiCr, or CuNb.

Next, patterning the gate metal layer to obtain the first metal layer 30. The first metal layer 30 includes the plurality of driving gates 31, the plurality of storage electrode elements 32, and the plurality of switch gates 33. Wherein, one driving gate 31 and one storage electrode element 32 are located on one side of one corresponding driving active part 21 away from the substrate 10. One switch gate 33 is located on one side of one corresponding switch active part 22 away from the substrate 10.

Figure 10D:
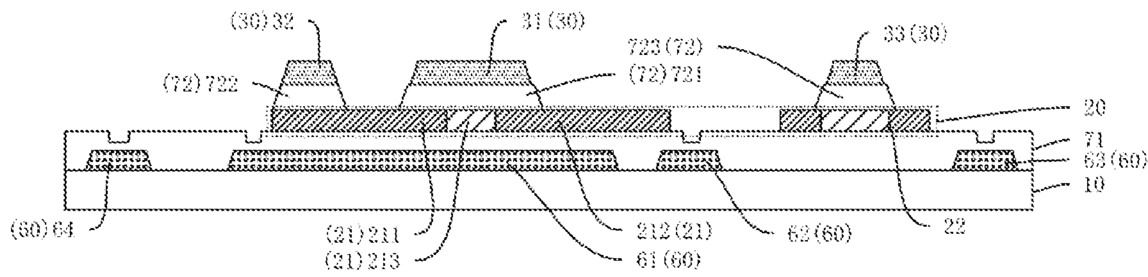

Then using each driving gate 31, each storage electrode element 32, and each switch gate 33 to perform self-alignment, and patterning the insulating material layer to obtain the gate insulating layer 72. The gate insulating layer 72 includes the first insulating part 721 between the driving gate 31 and the driving active part 21, the second insulating part 722 between the storage electrode element 32 and the driving active part 21, and the third insulating part 723 between the switch gate 33 and the switch active part 22. Next, performing conductive treatment on a position where the switch active part 22 needs to be overlapped with the source and drain, as shown in FIG. 10D.

Optionally, the distance from the boundary of the orthographic projection of the channel subsection 213 on the substrate 10 to the boundary of the orthographic projection of the driving gate 31 on the substrate 10 may be greater than or equal to 2.5 μm.

Preferably, the distance from the boundary of the orthographic projection of the channel subsection 213 on the substrate 10 to the boundary of the orthographic projection of the driving gate 31 on the substrate 10 may be greater than or equal to 2.75 μm, and the length of the channel subsection 213 in the first direction may be less than or equal to 2.5 μm and greater than or equal to 2 μm.

Figure 10E:
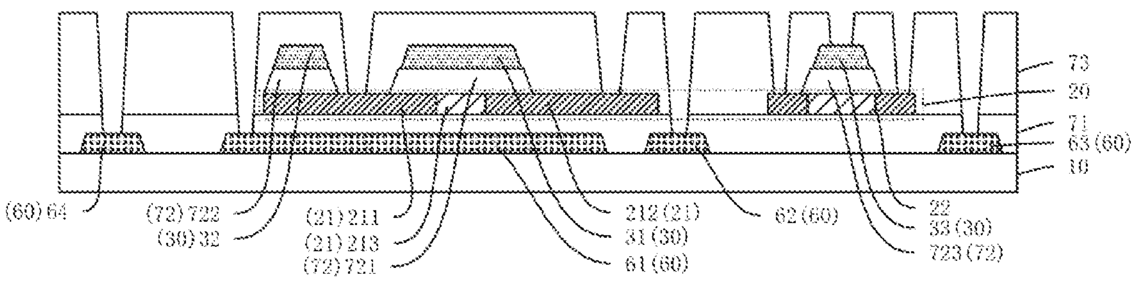

Forming the interlayer dielectric layer 73 on the first metal layer 30, patterning the interlayer dielectric layer 73 and the buffer layer 71, and forming a plurality of second vias on the buffer layer 71 to expose the first conductive subsection 211, the second conductive subsection 212, the light-shielding parts 61, the first power signal lines 62, the data lines 63, and the second power signal lines 64, as shown in FIG. 10E.

Optionally, a material of the interlayer dielectric layer 73 may include at least one of SiOx, SiNx, or SiNOx.

Figure 10F:
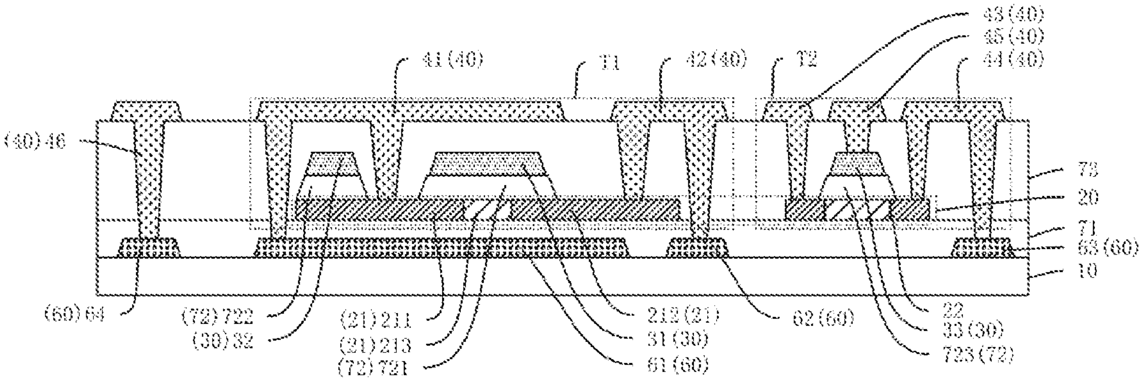

Forming a source-drain metal layer on the interlayer dielectric layer 73, and patterning the source-drain metal layer to obtain the second metal layer 40. The second metal layer 40 includes the plurality of driving sources 41, the plurality of driving drains 42, the plurality of switch sources 43, the plurality of switch drains 44, the plurality of scan lines 45, and the plurality of connecting parts 46. Wherein, one driving source 41, one driving drain 42, one driving gate 31, and one driving active part 21 correspond to each other to form one driving transistor T1. Each of the driving sources 41 is electrically connected to the first conductive subsection 211 by the second vias passing through the interlayer dielectric layer 73, and is electrically connected to the light-shielding parts 61 by the second vias passing through the interlayer dielectric layer 73 and the buffer layer 71. Each of the driving drains 42 is electrically connected to the second conductive subsection 212 by the second vias passing through the interlayer dielectric layer 73, and is electrically connected to the first power signal lines 62 by the second vias passing through the interlayer dielectric layer 73 and the buffer layer 71. Each of the switch sources 43 is electrically connected to the switch active parts 22 by the second vias passing through the interlayer dielectric layer 73. Each of the switch drains 44 is electrically connected to the switch active parts 22 by the second vias passing through the interlayer dielectric layer 73, and is electrically connected to the data lines 63 by the second vias passing through the interlayer dielectric layer 73 and the buffer layer 71, as shown in FIG. 10F.

It should be noted that in this embodiment, the driving source 41 extends in the direction adjacent to the driving drain 42 and covers the channel subsection 213. That is, the orthographic projection of the channel subsection 213 on the substrate 10 is within the coverage range of the orthographic projection of the driving source 41 on the substrate 10.

A material of the source-drain metal layer may be any one of Mo, Mo/Al, Mo/Cu, MoTi/Cu, IZO/Cu, Mo/Cu/MoTiNi, Ni/Cu/Ni, MoTiNi/Cu/MoTiNi, NiCr/Cu/NiCr, or CuNb.

Figure 10G:
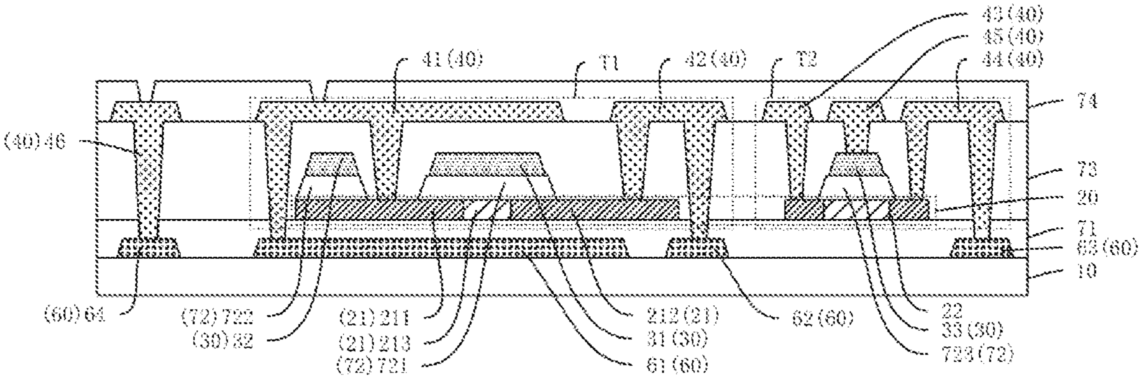

Forming the passivation layer 74 on the second metal layer 40, and patterning the passivation layer 74 to obtain a plurality of third vias, as shown in FIG. 10G.

Optionally, a material of the passivation layer 74 may include at least one of SiOx, SiNx, or SiNOx.

Forming an electrode metal material layer on the passivation layer 74, and patterning the electrode metal material layer to obtain the third metal layer 50. The third metal layer 50 includes the first electrode elements 51 and the second electrode elements 52, the first electrode elements 51 are electrically connected to the driving sources 41 by the third vias passing through the passivation layer 74, and the second electrode elements 52 are electrically connected to the connecting parts 46 by the third vias passing through the passivation layer 74.

In another embodiment of the present disclosure, referring to FIGS. 4 and 11A to 11C, a difference of this embodiment from the previous embodiment is that:

The first power signal lines 62 are not formed in the fourth metal layer 60.

Figure 11A:
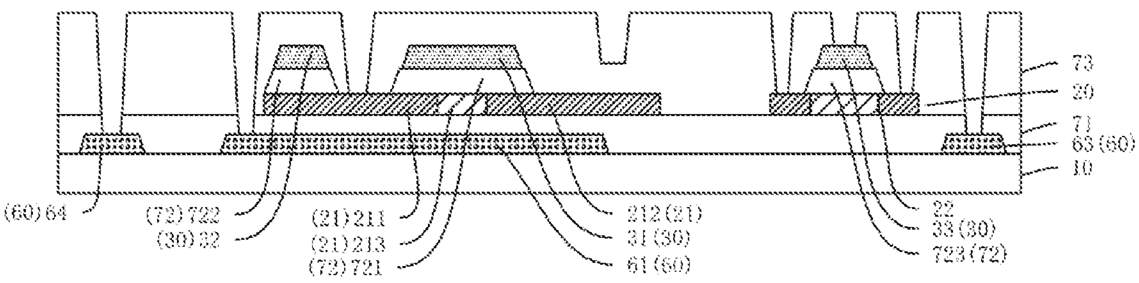
FIGS. 11A to 11C are schematic structural diagrams of the display panel during another manufacturing steps.

After the interlayer dielectric layer 73 is formed on the first metal layer 30, the interlayer dielectric layer 73 is patterned to form a plurality of vias, specifically including a plurality of fourth vias that expose the second power signal lines 64, the light-shielding parts 61, the data lines 63, the first conductive subsection 211, the switch active parts 22, and the switch gates 33, and a plurality of fifth vias that are correspondingly located on the second conductive subsection 212 and not expose the second conductive subsection 212, as shown in FIG. 11A.

Figure 11B:
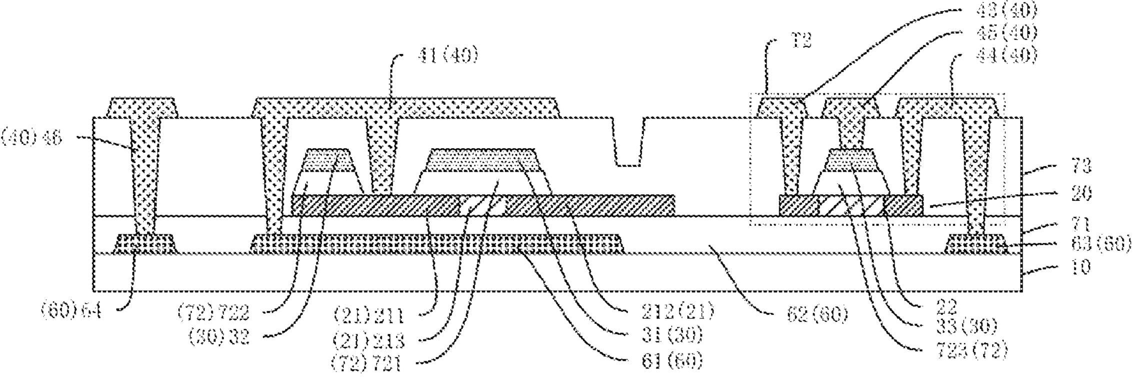

Forming a source-drain metal layer on the interlayer dielectric layer 73, and patterning the source-drain metal layer to obtain the second metal layer 40. The second metal layer 40 includes the driving sources 41, the switch sources 43, the switch drains 44, the scan lines 45, and the connecting parts 46. Wherein, each of the driving sources 41 is electrically connected to the first conductive subsection 211 by the fourth vias passing through the interlayer dielectric layer 73; each of the driving sources 41 is further electrically connected to the light-shielding parts 61 by the fourth vias passing through the interlayer dielectric layer 73 and the buffer layer 71; each of the switch sources 43 and the switch drains 44 are electrically connected to the switch active parts 22 by the fourth vias passing through the interlayer dielectric layer 73; the scan lines 45 are electrically connected to the switch gates 33 by the fourth vias passing through the interlayer dielectric layer 73; and the connecting parts 46 are electrically connected to the second power signal lines 64 by the fourth vias passing through the interlayer dielectric layer 73 and the buffer layer 71, as shown in FIG. 11B.

Then the passivation layer 74 is formed on the interlayer dielectric layer 73 and covers the second metal layer 40.

Figure 11C:
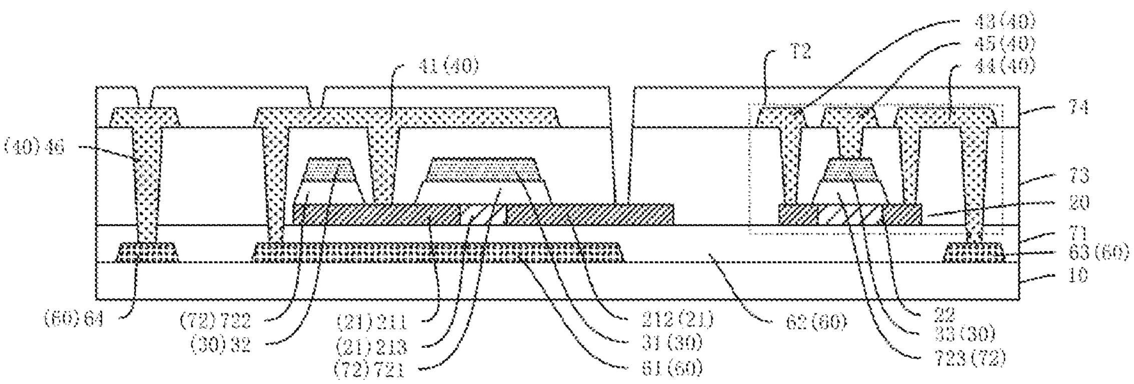

Next, the passivation layer 74 is patterned to form a plurality of sixth vias corresponding to the connecting parts 46, the driving sources 41, and the fifth vias to expose the connecting parts 46, the driving sources 41, and the second conductive subsection 212, as shown in FIG. 11C.

Forming the third metal layer 50 on the passivation layer 74, wherein, the third metal layer 50 includes the first electrode elements 51, the second electrode elements 52, the driving drains 42, and the first power signal lines 62. Wherein, the first electrode elements 51 are electrically connected to the driving sources 41 by the sixth vias passing through the passivation layer 74, the second electrode elements 52 are electrically connected to the connecting parts 46 by the sixth vias passing through the passivation layer 74, the driving drains 42 and the first power signal lines 62 are integrally formed, and the driving drains 42 are electrically connected to the second conductive subsection 212 by the sixth vias passing through the passivation layer 74 and the interlayer dielectric layer 73, as shown in FIG. 4.

Therefore, in the current technology, in the top gate structure, the active layers are shielded by the gates for conductive treatments to form channels and conductive portions on both sides of the channels, and the channel length is determined by the length of the gates, generally being equal to the length of the gates. However, compared to the current technology, in the embodiment of the present disclosure, the length of the channel subsection 213 of each driving active part 21 is less than the length of the driving gates 31, so the driving transistors T1 having the short channel can be realized, thereby effectively improving a current-passing capacity of the driving transistors T1. In addition, the driving gates 31 of the present disclosure are disposed on one side of the driving active parts 21 away from the substrate 10, thereby further preventing ions in film layers on one side of the driving gates 31 away from the driving active parts 21 from diffusing into the driving active parts 21 and affecting electrical properties of the driving active parts 21. Therefore, stability and a driving effect of the driving transistors T1 can be improved.

In addition, an embodiment of the present disclosure further provides a display device, which includes a display panel and a device body, and the display panel and the device body are combined into one integrated structure.

In the embodiment of the present disclosure, the display panel may be the display panel described in the above embodiments, and the device body may include a frame and a driver module.

The display device may be a display terminal such as a mobile phone, a tablet, a TV, etc., which is not limited herein.

In the above embodiments, the description of each embodiment has its own emphasis. For the parts that are not described in detail in an embodiment, can refer to the detailed description of other embodiments above.

The display panel and the manufacturing method thereof provided by the embodiments of the present disclosure are described in detail above. The specific examples are applied in the description to explain the principle and implementation of the disclosure. The description of the above embodiments is only for helping to understand the technical solution of the present disclosure and its core ideas, and it is understood that many changes and modifications to the described embodiment can be carried out without departing from the scope and the spirit of the disclosure that is intended to be limited only by the appended claims.

What is claimed is:

1. A display panel, comprising a plurality of driving transistors, wherein each of the driving transistors comprises a driving active part, a driving gate, and a driving source and a driving drain connected to the driving active part;

wherein the display panel further comprises:

a substrate;

an active layer disposed on one side of the substrate and comprising a plurality of driving active parts; and a first metal layer disposed on one side of the active layer away from the substrate and comprising a plurality of driving gates, wherein each driving gate is disposed on one side of a corresponding driving active part away from the substrate;

wherein each driving active part comprises a first conductive subsection and a second conductive subsection spaced apart from each other, and a channel subsection connected between the first conductive subsection and the second conductive subsection; and a size of the channel subsection in a first direction is less than a size of the driving gate in the first direction, the first direction is a direction in which the first conductive subsection points to the second conductive subsection, and wherein for each of the driving transistors, a total length of the channel subsection between the driving source and the driving drain in the first direction is less than or equal to 2.5 μm, wherein, the first conductive subsection and the second conductive subsection are formed by directly performing a conductive treatment on the driving active part after the driving active part is formed, and in the first direction, a length of an overlapping portion between an orthographic projection of the first conductive subsection on the substrate and an orthographic projection of the driving gate on the substrate, and a length of an overlapping portion between an orthographic projection of the second conductive subsection on the substrate and the orthographic projection of the driving gate on the substrate are all greater than or equal to 0.25 μm.

2. The display panel according to claim 1, wherein for each of the driving transistors, an orthographic projection of the channel subsection on the substrate is within a coverage range of an orthographic projection of the driving gate on the substrate.

3. The display panel according to claim 2, wherein a distance from a boundary of the orthographic projection of the channel subsection on the substrate to a boundary of the orthographic projection of the driving gate on the substrate is greater than or equal to 2.5 μm.

4. The display panel according to claim 1, wherein the first metal layer further comprises a plurality of storage electrode elements spaced apart from the driving gates, and each of the storage electrode elements is disposed on one side of a corresponding driving active part away from the substrate and is disposed opposite, in a vertical direction, to a corresponding first conductive subsection or a corresponding second conductive subsection of a respective driving active part.

5. The display panel according to claim 1, further comprising a second metal layer disposed on one side of the first metal layer away from the active layer, wherein the second metal layer comprises a plurality of driving sources, and each of the driving sources is disposed on one side of a corresponding driving gate away from a corresponding driving active part; wherein in each of the driving transistors, the driving source is electrically connected to the first conductive subsection, and for each of the driving transistors, an orthographic projection of the channel subsection on the substrate is within a coverage range of an orthographic projection of the driving source on the substrate.

6. The display panel according to claim 5, wherein the second metal layer further comprises a plurality of driving drains, and each of the driving drains is disposed on one side of a corresponding driving gate away from a corresponding driving active part and is electrically connected to a corresponding second conductive subsection.

7. The display panel according to claim 5, further comprising a third metal layer disposed on one side of the first metal layer away from the substrate and on a different layer from the second metal layer, wherein the third metal layer comprises a plurality of driving drains, and each of the driving drains is correspondingly disposed on one side of each of the driving gates away from each of the driving active parts and is electrically connected to the second conductive subsection.

8. The display panel according to claim 7, wherein the third metal layer is disposed on one side of the second metal layer away from the active layer, and the third metal layer further comprises first power signal lines and a plurality of first electrode elements; and each of the first electrode elements is electrically connected to each of the driving sources, one end of each of the driving drains is connected to the second conductive subsection, and another end of each of the driving drains is connected to the first power signal lines.

9. The display panel according to claim 7, wherein the second metal layer is disposed on one side of the third metal layer away from the active layer, the second metal layer further comprises a plurality of first electrode elements, and each of the first electrode elements is electrically connected to each of the driving sources; and wherein one end of each of the driving sources is connected to the first conductive subsection of each of the driving active parts, and another end of each of the driving sources is connected to each of the first electrode elements.

10. The display panel according to claim 5, further comprising a plurality of switch transistors, wherein each of the switch transistors is electrically connected to a corresponding driving transistor and comprises a switch active part, a switch gate, and a switch source and a switch drain connected to the switch active part;

wherein the active layer comprises a plurality of switch active parts, the first metal layer comprises a plurality of switch gates, and the second metal layer comprises a plurality of switch sources, a plurality of switch drains, and a plurality of scan lines; and each of the switch gates is correspondingly disposed above one side of a corresponding switch active part away from the substrate, and each of the scan lines is correspondingly disposed over one side of a corresponding switch gate away from a corresponding switch active part.

11. A manufacturing method of a display panel, wherein the display panel comprises a plurality of driving transistors, and each of the driving transistors comprises a driving active part, a driving gate, and a driving source and a driving drain connected to the driving active part;

wherein the manufacturing method of the display panel comprises following steps:

providing a substrate;

disposing an active layer formed with a plurality of driving active parts on one side of the substrate, and conductorizing each of the driving active parts to allow each of the driving active parts to be formed with a first conductive subsection and a second conductive subsection spaced apart from each other, and a channel subsection connected between the first conductive subsection and the second conductive subsection; and disposing a first metal layer on one side of the active layer away from the substrate, wherein the first metal layer is formed with a plurality of driving gates, and each of the driving gates is correspondingly disposed on one side of each of the driving active parts away from the substrate; wherein a length of the channel subsection in a first direction is less than a length of the driving gates in the first direction, and the first direction is a direction in which the first conductive subsection points to the second conductive subsection, and wherein for each of the driving transistors, a total length of the channel subsection between the driving source and the driving drain in the first direction is less than or equal to 2.5 μm, wherein, the first conductive subsection and the second conductive subsection are formed by directly performing a conductive treatment on the driving active parts after the driving active parts are formed, and in the first direction, a length of an overlapping portion between the orthographic projection of the first conductive subsection on the substrate and the orthographic projection of the driving gate on the substrate, and a length of an overlapping portion between the orthographic projection of the second conductive subsection on the substrate and the orthographic projection of the driving gate on the substrate are all greater than or equal to 0.25 μm.

* * * * *